United States Patent [19]

Ferguson

[11] 4,242,637
[45] Dec. 30, 1980

[54] APPARATUS FOR DETECTING SIGNAL PRECEDENCE

[75] Inventor: Keith M. Ferguson, San Jose, Calif.

[73] Assignee: Hewlett-Packard Company, Palo Alto, Calif.

[21] Appl. No.: 957,386

[22] Filed: Nov. 3, 1978

[51] Int. Cl.³ .............................................. H03K 5/26
[52] U.S. Cl. .................................. 328/110; 328/134; 328/147; 324/82; 368/118
[58] Field of Search ............... 328/109, 110, 146, 147, 328/134; 307/232; 324/82, 76 A, 185, 188

[56] References Cited

U.S. PATENT DOCUMENTS

| | | | |
|---|---|---|---|
| 2,940,073 | 6/1960 | Spranger et al. | 324/82 X |
| 3,409,830 | 11/1968 | Phillips | 328/147 X |
| 3,634,772 | 1/1972 | Katz | 328/134 X |
| 3,663,884 | 5/1972 | Pattantyus | 328/134 |
| 3,705,358 | 12/1972 | Bauman et al. | 328/110 |

Primary Examiner—John S. Heyman
Attorney, Agent, or Firm—David A. Boone

[57] ABSTRACT

The relative occurrence of first and second input signals is determined by sampling the output signal of a comparator which compares a predetermined voltage source output signal with the output signal from a ramp generator which is triggered by the first input signal. The sampling signal is provided in response to the second input signal after a preselected time delay. A balancing calibration is used to insure that if the signals are coincident, the ramp generator signal is equal to the voltage reference signal at the moment of sampling. Therefore, the precedence of the first and second input signals is determined by sampling the comparator output signal in response to the sampling signal and determining the relative values of the ramp voltage signal and the voltage reference signal at the time of sampling.

6 Claims, 6 Drawing Figures

APPARATUS FOR DETECTING SIGNAL PRECEDENCE

BACKGROUND AND SUMMARY OF THE INVENTION

A precedence detector is a circuit for determining which of two signals occurs first. Various previous techniques have been used. For instance, using one signal to clock a D-type flip-flop, with the second signal applied to the "D" input. These have had the disadvantage that they provided no convenient method to compensate for differing delays in the signal transmission paths, and could contain an inherent off-set in the detector itself (related, for example, to the set up and hold times of a "D"-type flip-flop).

In making the determination of which signal occurred first, it is important to consider the physical location of the points at which the signals are to be compared. This includes the path that is necessary to transmit the signals to the precedence detector circuit. If the two transmission paths have unequal delays, whether it be because of different wire lengths or different propagation speeds of devices intermediate to the signal source and the precedence detector circuit, then the signals arriving at the inputs to the precedence detector circuit will have a different time relationship than those at the measurement points which are of interest.

In accordance with the preferred embodiment of the present invention, these transmission path delay differences can be cancelled through the use of a balancing technique. To balance the precedence detector, calibration signals known to be coincident in time are applied to the source points of the signals whose relative occurrence in time is to be determined. If the two source points are located at approximately the same point, then the same signal can be applied to both inputs. The balancing operation is then performed.

In another application, balancing of the precedence detector circuit can be performed with calibrating signals at the two source points that may differ in time. In this case, future precedence measurements compare the relative timing of the measured signals to that of the calibration signals.

In accordance with the preferred embodiment of the present invention, first and second input signals are received. The first input signal is used to trigger a ramp voltage generator which provides a ramp output signal. This ramp output signal and a preselected voltage reference signal are applied to a comparator whose output signal indicates the relative values of the ramp signal voltage and the preselected voltage reference signal. The second input signal is delayed by a fixed time period and thereafter causes the providing of a sampling signal which is used to sample the comparator output signal. The value of the comparator output signal at the time of sampling indicates the relative occurrence of the first and second input signals.

DESCRIPTION OF THE PREFERRED EMBODIMENT

Figure 1:
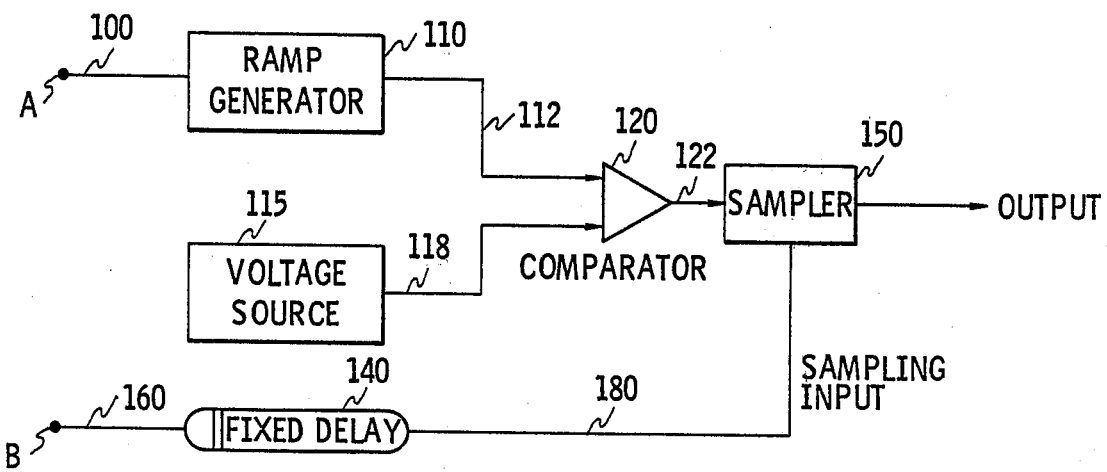
FIG. 1 is a basic block diagram for a circuit in accordance with the preferred embodiment.

The input signal received on line 100 is used to start ramp generator circuit 110. Ramp generator 110 provides the ramp signal output on a line 112 which is coupled to one input of comparator 120. The other input to comparator 120 is provided on line 118 from a reference voltage source 115. The other input signal of interest, i.e., the one at point B, is received on a line 160 and input to fixed delay circuit 140. The amount of delay provided by fixed delay circuit 140 is not critical, nor need it be known. However, it is necessary that it be stable and remain constant during the balancing operation described below and through the precedence measurements following the balancing operation. The effect of this delay is one of the factors compensated by the balancing operation. The delayed signal is then output on a line 180 which drives sampler 150. Sampler 150 samples the output from comparator 120 which it receives on a line 122. The output of sampler 150 then indicates whether the signal received on line 100 or the signal received on line 160 occurred first. Of course, in making this determination, it is necessary to consider the physical location of the point at which the signals are to be compared. It is assumed that points A and B are the same distance respectively from ramp generator circuit 110 and fixed delay circuit 140. If the two transmission paths have unequal delays because of different lengths, different propagation speeds, different delays through amplifier circuits, logic gates, or other signal conditioning devices between the points of interest and the precedence detector circuit disclosed, then the signals arriving at the inputs to the precedence detector will have a different time relationsip than those at points A and B. However, using the preferred embodiment, one may zero out the effects of these differing transmission delays as well as providing for cancelling of the effects of delays within the precedence detector circuitry itself through the balancing technique described.

The precedence detector is balanced by applying calibration signals known to be coincident in time to both points A and B. If A and B are located at approximately the same physical point, then the same exact signal can be applied to both inputs. The balance operation is then performed by the precedence detector circuitry.

Alternatively, in some applications it may be desired to perform the balancing with calibrating signals at A and B that may differ in time. In this application, in that case, future precedence measurements after a balancing operation of that type would compare the relative timing of the measured signals to that of the calibration signals.

Balancing is accomplished by repetitively applying the calibration signals at points A and B. The voltage level output on line 118 from voltage reference source 115 is varied until it is set such that the ramp voltage is crossing the voltage level just at the time of sampling. Alternatively, one could adjust the delay in delay line 140 or the slope of the ramp signal generated by ramp generator 110 to achieve this same condition. Once this condition is achieved, the circuit is balanced and the circuitry is not adjusted during the subsequent measurements.

Once the precedence detector is balanced, the signals of interest can be applied to points A and B. If at the time of the sampling the ramp voltage has not yet crossed the voltage source voltage, the signal received at point B is known to have occurred before the signal received at point A.

Alternatively, if the calibration signals were separated by a time, $\Delta t_c = t_{bc} - t_{ac}$, then the measured signals are known to be separated by a time, $\Delta t_m = t_{bm} - t_{am}$ such that $\Delta t_m$ is less than $\Delta t_c$. If the ramp has crossed the level voltage at the time of sampling, then $\Delta t_m$ is greater than $\Delta t_c$.

Figure 2:
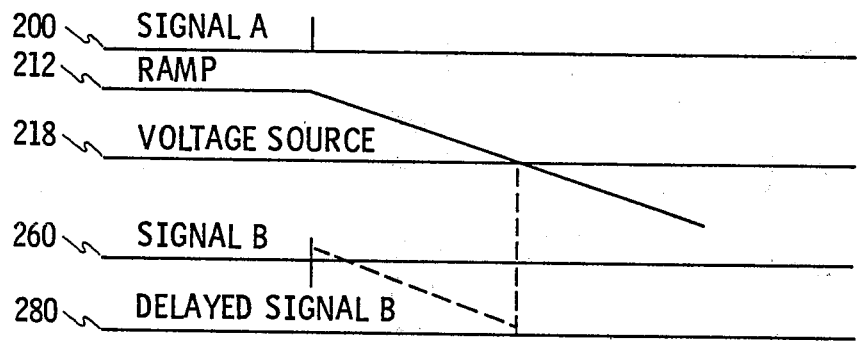
FIG. 2 illustrates the wave forms present in the circuit of FIG. 1 when the signals are coincident and the circuit is balanced.

Referring to FIG. 2, the waveforms for the various signals of interest are shown. The signal received at point A is shown as waveform 200. The output of ramp generator 110 is shown as waveform 212. The output of the voltage source is shown as waveform 218. The waveform of the signal received at point B is shown as waveform 260, while the output of fixed delay circuit 140 is shown as waveform 280. Note that the ramp voltage waveform 212 and voltage source waveform 218 will be at the same voltage at the time the sampling waveform 280 occurs if signals 200 and 260 were originally coincident in time and the circuit has been balanced as described above. Note that the waveform shown in FIG. 2 would also be the desired conditions when the circuit is balanced and the same signal was being input as both waveform 200 and waveform 260.

Averaging can be used to reduce the effects of random noise signals on the detector circuitry, i.e., a predetermined number, N, of measurements can be made without varying the input conditions. A decision would then be made based on the majority of the results. This technique can be used both while balancing the detector and during the measurement process itself.

Figure 3:
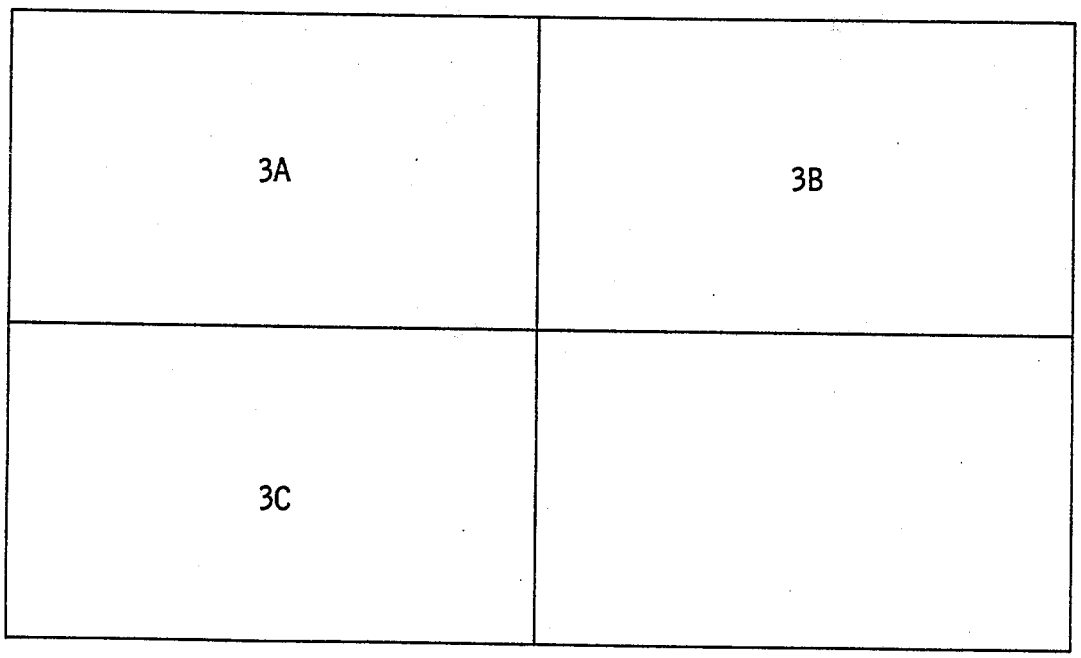
FIG. 3 shows the relationship of FIGS. 3A, 3B, and 3C.
Figure 3A:
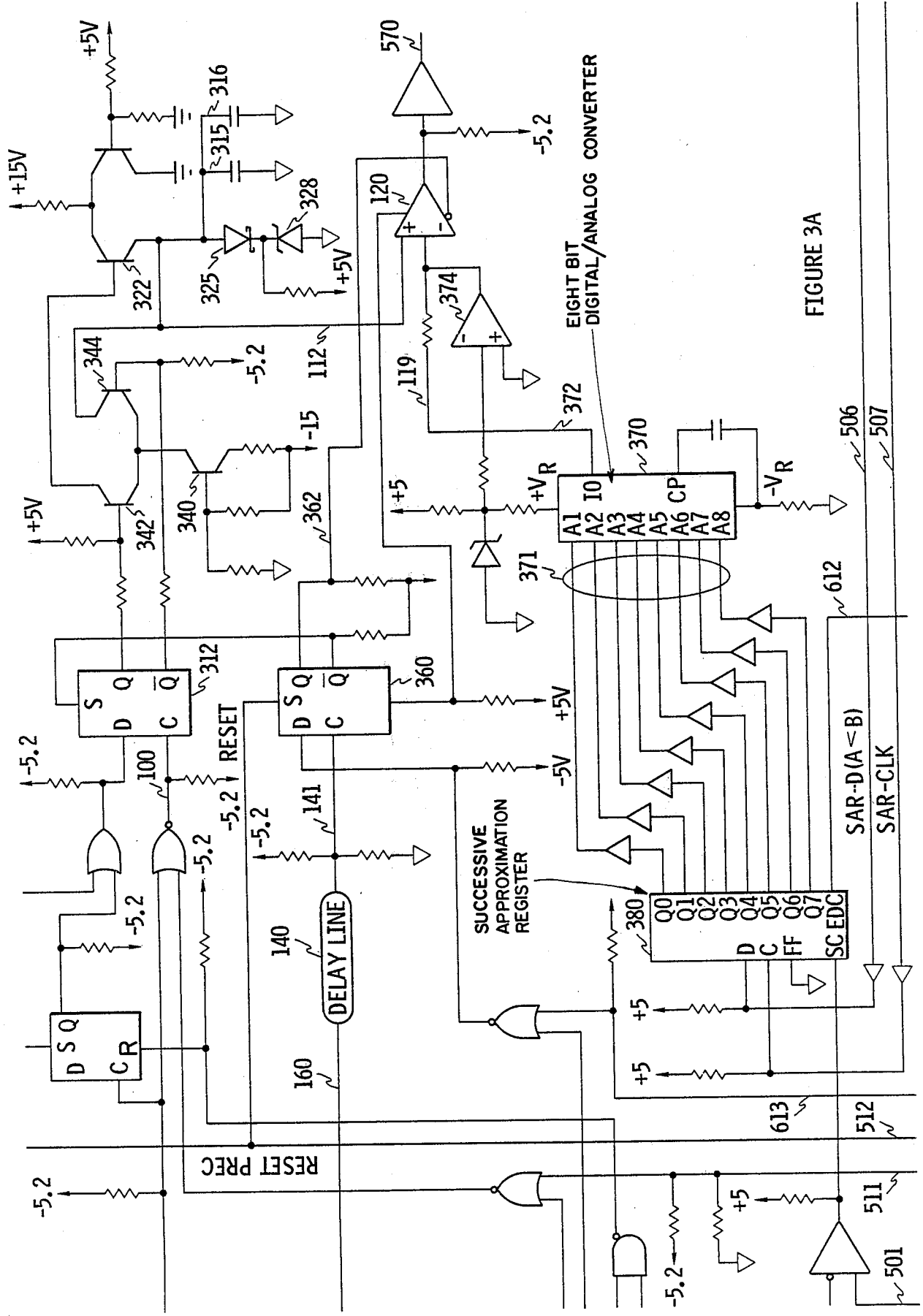
FIGS. 3A, 3B, and 3C, taken together, are a detailed schematic diagram of a circuit in accordance with the block diagram of the embodiment shown in FIG. 1, and including additional automatic balancing circuitry.
Figure 3B:
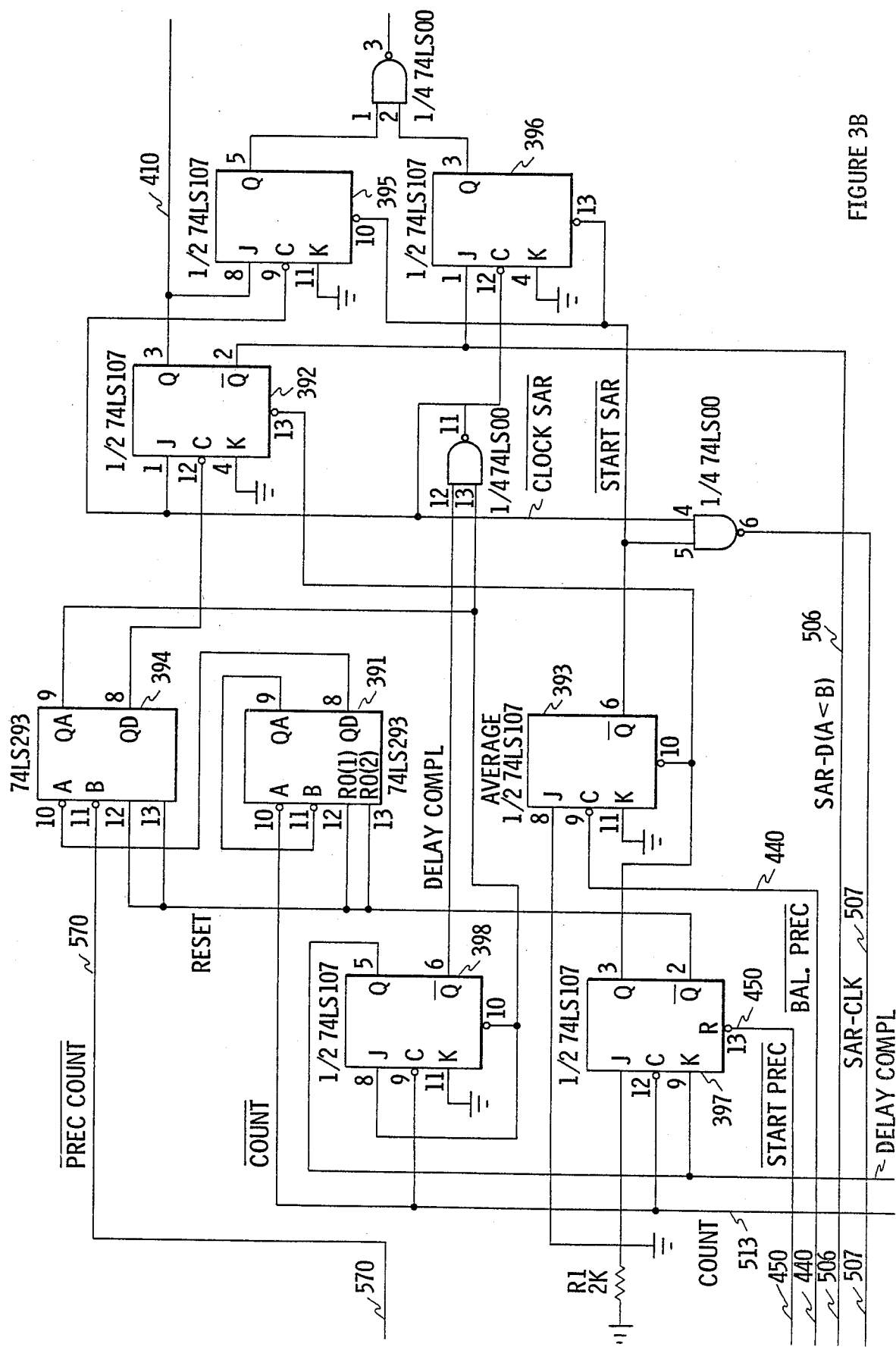
Figure 3C:
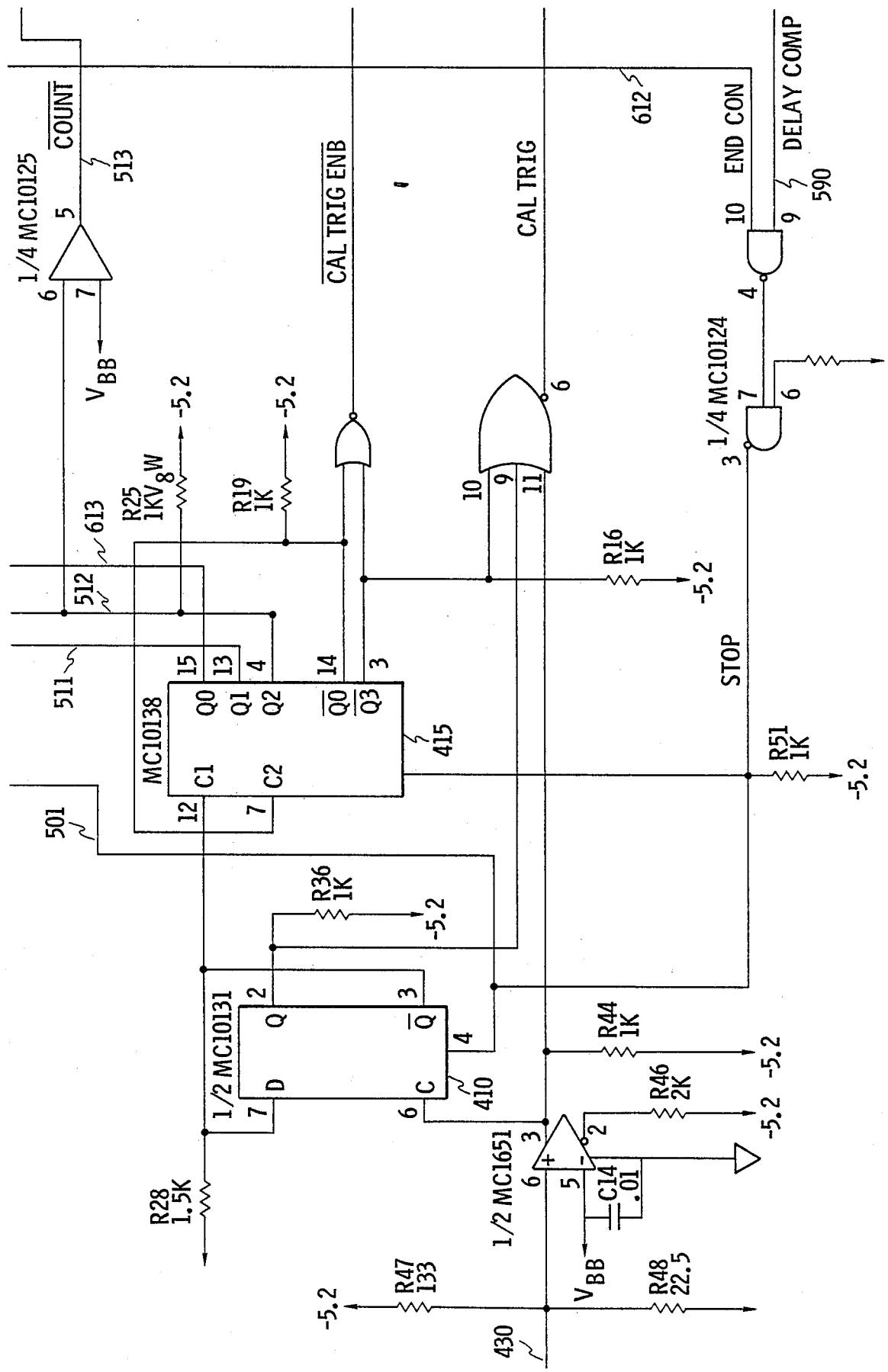

Referring now to FIGS. 3A, 3B, and 3C, the signal from point A is received on line 100 while the signal from point B is received on line 160. The signal received from point A clocks flip-flop 312 to a cleared state causing initiation of the ramp voltage signal which appears across capacitor 315. Prior to initiation of the ramp, capacitor 315 is charged to a positive voltage by current from transistor 322 and clamped by diode 325 to a voltage set by breakdown diode 328.

The initiation of the ramp signal begins when flip-flop 312 is cleared, switching the current drawn by current source transistor 340 from transistor 342 to transistor 344. This current is drawn out of capacitor 315 which generates the ramp voltage. At the same time, the cessation of current through transistor 342 causes its collector voltage to rise which cuts off the current through transistor 322. Upon completion of the generation of the ramp signal as described more fully below, flip-flop 312 is set, current being drawn from the current source transistor 340 switches back from transistor 344 to transistor 342 (thereby no longer drawing current from capacitor 315). Also, transistor 322 is turned on and supplies current to recharge capacitor 315. Variable capacitor 316 is provided and allows an adjustment of the slope of the ramp voltage. The ramp output signal on line 112 is then supplied to comparator 120 (comparator 120 is similar to the MC1651 or the like, which is manufactured by Motorola and others.)

The signal received from point B on line 160 passes through delay line 140. The output of delay line 140 is then coupled to the clock input of flip-flop 360. In the preferred embodiment, the delay line 140 comprises a coaxial cable. Once flip-flop U12 is clocked to a clear state, the enable signal on line 362 to pin 13 of comparator 120 is removed, thereby locking the comparator output in the state it had just prior to removal of the enable signal. At the same time, the clearing of flip-flop 360 forces flip-flop 312 to set, thus resetting the ramp generator circuitry as described above.

If the ramp signal voltage crosses, i.e., decreases to a voltage less than, the voltage level input to the comparator on line 119 before the comparator enable signal on line 362 is removed, the resulting change in the comparator output will directly reset flip-flop 360, thereby setting flip-flop 312 and terminating the generation of the ramp signal. In this case, there is no need to wait for the receipt of the signal on line 160 from point B, since it is already known that the signal at point A occurred before the signal at point B.

The voltage level to comparator 120 is supplied from a digital to analog converter consisting of circuit 370 which is similar to an MC1408L-8 or the like, which is manufactured by Motorola and others, and amplifier 374 which is similar to the LM307 or the like, which is manufactured by National Semiconductor and others. Circuit 370 converts an eight-bit digital input received on line 371 to an analog current output on line 372. The operational amplifier 374 then converts this current to an analog voltage on line 119. The digital input on line 371 is supplied from circuit 380, a successive approximation register similar to the MC14559 manufactured by Motorola and others. During the balance operation, this register is used to adjust the voltage level output on line 119 until it is equal to the ramp voltage on line 112 at the time the sampling occurs. During subsequent measurements after this balancing operation, the values contained in circuits 380 and 370 are not varied, but simply hold this voltage on line 119 constant.

Flip-flop and registers 391 through 398 comprise the averager and control circuitry. Register 391 counts the number of cycles (up to 16) that will form the samples taken. The results of each sample will be either "A before B" or "A after B". Unless a majority of the results (nine samples in the circuit of the preferred embodiment) indicate "A after B", the conclusion will be "A before B". The B input side of register 394 counts the "A before B" results. If eight "A before B" results are received, flip-flop 392 is clocked, thus producing an "A before B" output from the circuit board on line 410. Registers 398, 393 and 397 comprise a state machine control circuit which controls operation during both "balance and measurement operations. During the balance operations, flip-flops 395 and 396 detect the condition where the successive approximation register output goes to either limit, thus indicating the voltage source has been programmed to one of its limits. This represents a "failed to balance" condition, indicating that the A and B input signals were separated in time by more than the range the precedence detector circuit of the preferred embodiment can handle. This range is determined by the slope of the ramp signal on line 112 as well as the range of the voltage signal produced on line 119. For equal range capability on either side of the actual coincident points, the fixed delay line 140 and/or the slope of the ramp should be adjusted to place the sampling pulse at the time when the ramp crosses the mid-range point of the voltage source with coincident signals applied at points A and B. Various timing and control signals are generated using circuits 410 and 415.

The basic clock control signal in the preferred embodiment is a 10 MHz signal supplied on line 430. The balancing operation is accomplished under control of the balance precedence detector signal supplied on line 440. When the signal on line 440 is pulsed to a low logic state, the circuitry will self-calibrate by adjusting the voltage created in response to the value in circuit 380 until the ramp signal on line 112 is equal to the voltage level on line 119 when the sampling signal on line 362 occurs. Of course, during this calibration, the coincident signals are being repetitively applied at points A and B. Once the balancing operation is complete, the precedence detector may be used to determine the relative occurrence of the two input signals coupled to points A and B under the control of the control signal on line 450.

I claim:

1. A method for determining the first to occur between first and second input signals at first and second points respectively, said method comprising the steps of:
   providing a ramp signal which varies in a preselected manner in response to said first input signal;
   providing a control signal in response to said second input signal and a preselected time delay;
   determining the relative values of said ramp signal and a reference signal in response to said control signal; and
   providing an indication of the first to occur between said first and second input signals in response to the relative values of said ramp signal and said reference signal.

2. The method as in claim 1 and further comprising the steps of:
   averaging the indications of the relative occurrence of said first and second input signals; and
   providing an indication of the predominant indication in response to said averaging.

3. The method as in claim 2 wherein the step of providing said ramp signal comprises the step of providing a voltage ramp signal and the step of providing said reference signal comprises the step of providing a voltage reference signal.

4. The method as in claim 1 and further comprising the steps of:
   applying coincident signals simultaneously at said first and second points as the first and second input signals; and
   adjusting said preselected time delay to cause said control signal to be coincident with the ramp signal being equivalent to said reference signal.

5. The method as in claim 1 and further comprising the steps of:
   applying coincident signals simultaneously at said first and second points as the first and second input signals; and
   adjusting said reference signal to cause said control signal to be coincident with the ramp signal being equivalent to said reference signal.

6. The method as in claim 4 or 5 wherein the step of applying coincident signals includes the step of repetitively applying said coincident signals simultaneously as both the first and second input signal.

* * * * *